US009568923B1

(12) United States Patent
Demetriou et al.

(10) Patent No.: US 9,568,923 B1
(45) Date of Patent: Feb. 14, 2017

(54) DETERMINING A TIME FOR CORRECTIVE ACTION IN A DATA CENTER

(71) Applicant: International Business Machines Corporation, Armonk, NY (US)

(72) Inventors: Dustin W. Demetriou, Poughkeepsie, NY (US); Roger R. Schmidt, Poughkepsie, NY (US); Vidhya Shankar Venkatesan, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/923,647

(22) Filed: Oct. 27, 2015

(51) Int. Cl.
G05D 23/00 (2006.01)
G05D 23/19 (2006.01)
H05K 7/20 (2006.01)

(52) U.S. Cl.
CPC .......... *G05D 23/1902* (2013.01); *G05D 23/00* (2013.01); *G05D 23/1906* (2013.01); *H05K 7/207* (2013.01); *H05K 7/20836* (2013.01)

(58) Field of Classification Search
CPC .... G05D 23/00; G05D 23/19; G05D 23/1902; G05D 23/1904; G05D 23/1906; G05D 23/1919; G05D 23/192; G05D 23/1923; G05D 23/1927; G05D 23/193; G05D 23/1931; G05D 23/1932; G05D 23/1935; G05D 23/1951; H05K 7/20; H05K 7/20581; H05K 7/2059; H05K 7/206; H05K 7/20836
See application file for complete search history.

(56) References Cited

U.S. PATENT DOCUMENTS

| 8,155,922 | B2 | 4/2012 | Loucks |
| 8,386,824 | B2 | 2/2013 | Artman et al. |
| 8,509,959 | B2 | 8/2013 | Zhang et al. |
| 8,631,411 | B1 | 1/2014 | Ghose |
| 8,849,630 | B2 | 9/2014 | Amemiya et al. |
| 8,924,026 | B2 | 12/2014 | Federspiel et al. |
| 2002/0166659 | A1* | 11/2002 | Wagner ................ F24F 11/0012 165/254 |
| 2011/0040532 | A1 | 2/2011 | Hamann et al. |

(Continued)

OTHER PUBLICATIONS

Erden, Hamza, Salih., et al; "A Hybrid Lumped Capacitance-CFD Model for the Simulation of Data Center Transients" HVAC&R Research; (2014) vol. 20; Issue 6; pp. 688-702.

*Primary Examiner* — Van Trieu
(74) *Attorney, Agent, or Firm* — Cantor Colburn LLP; Margaret A. McNamara

(57) ABSTRACT

Aspects include a method, system, and computer program product for determining a time to a threshold temperature of an electronic device in a data center. A method includes measuring parameters for an electronic device and the data center. A rate of change of temperature is determined for the device based on the parameters. The rate of change is compared to a rate of change threshold. It is determined that a cooling system is operating below a threshold when the rate of change is above the threshold. A first time is determined, where the first time is based the rate of change of temperature and a machine learning model. The first time and second time are compared, where the second time is a time to restore the cooling system to above the threshold. A signal is transmitted when the first time is less than the second time.

20 Claims, 6 Drawing Sheets

(56) References Cited

U.S. PATENT DOCUMENTS

| | | | |
|---|---|---|---|
| 2011/0239025 A1 | 9/2011 | Artman et al. | |
| 2012/0160444 A1* | 6/2012 | Benlarbi | G06F 1/206 165/11.1 |
| 2012/0160469 A1* | 6/2012 | Garaschenko | G05D 23/1919 165/287 |
| 2012/0166014 A1* | 6/2012 | Garaschenko | G05D 23/1919 700/300 |
| 2014/0202678 A1* | 7/2014 | Goth | H05K 7/20772 165/287 |
| 2014/0278333 A1 | 9/2014 | Gupta et al. | |
| 2014/0346993 A1* | 11/2014 | Mishima | H02P 7/04 318/400.38 |
| 2015/0057828 A1 | 2/2015 | Civilini | |

* cited by examiner

DETERMINING A TIME FOR CORRECTIVE ACTION IN A DATA CENTER

BACKGROUND

The present invention relates generally to data centers and, more specifically, to a data center control system that predicts the time for corrective action in response to an event.

Data centers are facilities where large numbers of electronic computing systems, such as servers for example, are housed. Due to the high density of electronic systems, the facility may use a variety of cooling systems to maintain a desired environment. It is desirable to maintain the temperature within the data center within an operating range so the electronic systems operate with a desired level of reliability and performance. In the event the facility cooling systems are operating below a threshold, the facility may take steps to either restore the cooling system performance or reduce the workload on the electronic systems.

SUMMARY

Embodiments include a method, system, and computer program product for determining a time to a threshold temperature of an electronic device in a data center. A method includes measuring with a plurality of sensors a plurality of operating parameters for a first electronic device and the data center. A first rate of change of temperature is determined for the first electronic device, the first electronic device being operated with a first workload, the first rate of change of temperature being based at least in part on the measured operating parameters. The first rate of change is compared to a rate of change threshold. It is determined that a data center cooling system is operating below a performance threshold when the first rate of change is above the performance threshold. It is determined that a first time to until a first temperature associated with the first electronic device is above a device threshold, the determination of the first time based at least in part on the first rate of change of temperature and a machine learning model. The first time is compared to a second time, the second time being a time period for restoring the data center cooling system to above the performance threshold. A warning signal is transmitted to an operator when the first time is less than the second time.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments and aspects of the subject invention are directed to a system and method for monitoring the operation of data center having a plurality of electrical device, such as computer servers for example. The system and method can provide advantages in predicting a time period to reach a threshold temperature for each piece of electrical device. This prediction may be based on a rate of change in temperature, historical data and the status of support device, such as cooling device for example. The system and method provide the operator with a prediction on the amount of time available to take mitigation steps to maintain the temperature of the electrical device below the threshold temperature. In some embodiments, the system and method may also automatically adjust the operation of the data center by changing operating characteristics of the cooling system to increase the cooling capacity or balancing workloads within the electronic device to reduce the generation of thermal energy.

Figure 1:
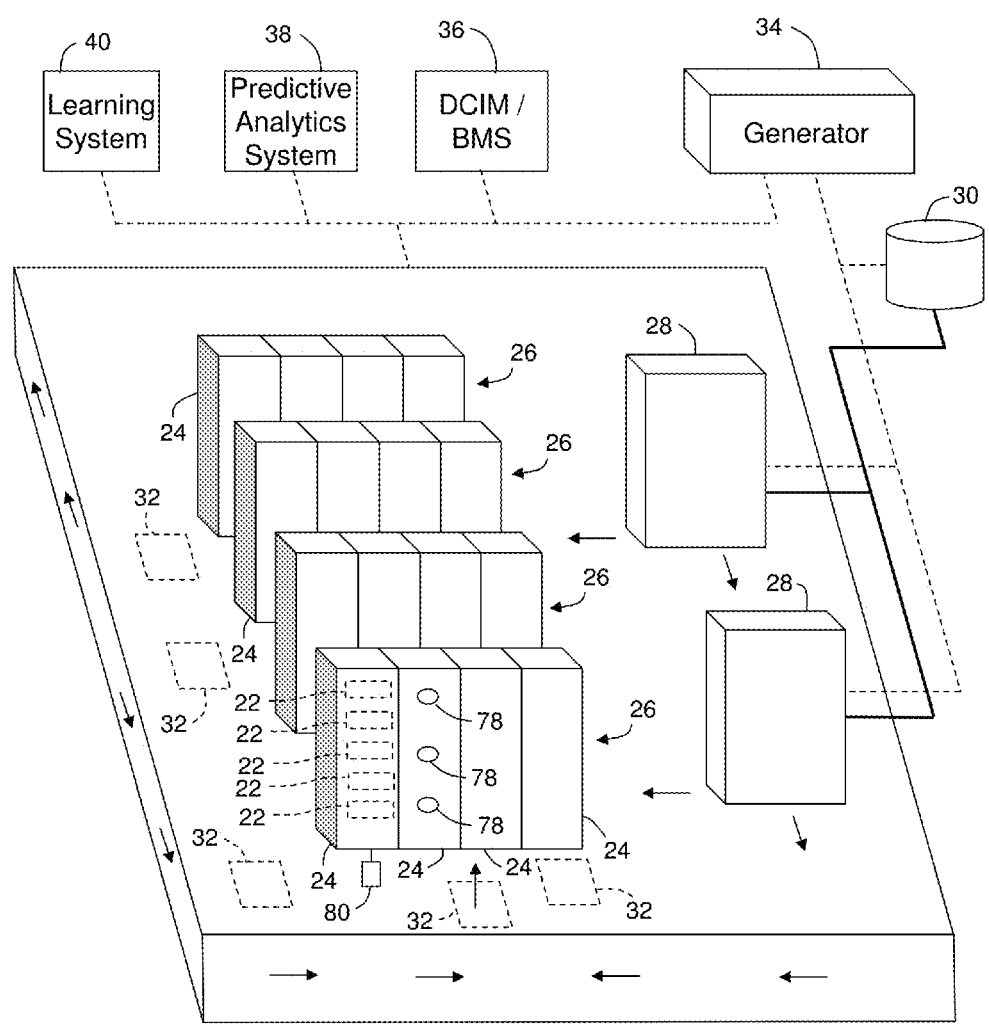
FIG. 1 depicts a diagram of a data center in accordance with some embodiments of this disclosure.

Turning now to FIG. 1, a data center 20 is generally shown in accordance with an embodiment. As used herein, a data center 20 is a facility that contains or houses a plurality of electronic devices, such as computer servers 22 for example. In one embodiment, the data center 20 includes racks 24 that each contains a plurality of computer servers 22. It should be appreciated that while FIG. 1 shows the computer servers 22 being located in a single rack 24, this is for clarity purposes and the claimed invention should not be so limited. In an embodiment, the data center 20 includes a plurality of racks 24 arranged in rows 26 which each rack including one or more electronic devices. It should further be appreciated that while embodiments herein describe the electronic devices as computer servers, the claimed invention should not be so limited. In other embodiments, the electronic devices may include other equipment such as electronic computing devices for example.

The data center 20 further includes one or more cooling system units 28. The cooling system units 28 condition air, such as by changing the temperature and humidity of the air being delivered to the data center. The cooling system for the data center may include a plurality of systems including in-room air conditioning units 28 and chillers 30. The cooling system may further include vents, such as floor vents 32 for example, that allow the supply of conditioned air from cooling system units 28 to be delivered to the data center 20. Generally, the cooling system units 28 are arranged to direct conditioned air into spaces, such as between rows 26. It should be appreciated that in some embodiments there may be less cooling system units 28 than there are rows 26, resulting in what is sometimes colloquially referred to as "cold" rows and "hot" rows. As such, the inlet air temperature to some of the computer servers 22 may be elevated relative to other computer servers 22 in the data center 20 depending on a number of factors include the location of the computer server 22 within the data center 20, the locations of the cooling system units 28, the locations of the vents 32 and the amount of thermal energy being produced by adjacent computer servers 22.

Maintaining the temperature of the data center 20 is desirable as the operating temperature of the environment impacts the operation, reliability and durability of the computer servers 22. Standards have been promulgated by organizations such as the American Society of Heating, Refrigeration and Air-Conditioning Engineers (ASHRAE) that define different categories of operating environments in data centers. Since these standards were introduced in 2004, some categories of the standard have increased the allowable operating temperatures considerably. For example, ASHRAE TC 9.9 2011 Thermal Guidelines for Data Processing Environments provides a recommended operating range and four categories of "allowable" operating environments. The defined temperatures within the guidelines can be very different, such as a class A1 range of 15 C to 32 C to a class A4 range of 5 C to 40 C. It should be appreciated that in many instances higher the operating temperatures have a negative impact on the reliability and the durability of the computer servers 22. Commonly, electronic devices such as computer servers have a maximum temperature at which they will function, such as 45 C. When the air inlet temperature reaches the maximum temperature, the computer server 22 may power off to prevent damage to the circuitry.

As data center operators have increased the ambient temperature of the data center 20, the time frame for adjusting to events that impact temperature has decreased. These events, such as a mechanical malfunction of the cooling system units 28 or chillers 30 or a loss of electrical power for example, may result in a loss of cooling capacity in the data center 20. It should be appreciated that amount of time for a data center operator to provide corrective action before the computer servers reach a maximum operating threshold (e.g. 45 C) is longer if the data center is operating at an air temperature 20 C rather than an air temperature of 35 C or 40 C.

The data center 20 may further includes a backup generator 34 that provides electrical power to the cooling system components, such as units 28 and chillers 30 for example. As will be discussed in more detail herein, the data center 20 may also include one or more computer control systems 36, 38, 40 that monitor and control the operations of the data center 20. These control system may include a building-management-system (BMS) and data-center-infrastructure-management (DCIM) 36 that provides centralized management and monitoring of the data centers systems, such as the cooling system for example. The control system may also include a predictive analytics system 38 that analyzes operating parameters in real time and determines when an individual electronic device is operating outside of a desired operating point. The control system may further include a learning system 40 that uses machine learning techniques to determine the characteristics of the particular data center 20 that it is monitoring over time. As will be discussed in more detail below, the learning system 40 provides a data base of information based on historical data that is used by the predictive analytics system 38 to predict an amount of time that it will take an individual computer server 22 to reach a maximum operating threshold temperature.

Figure 2:
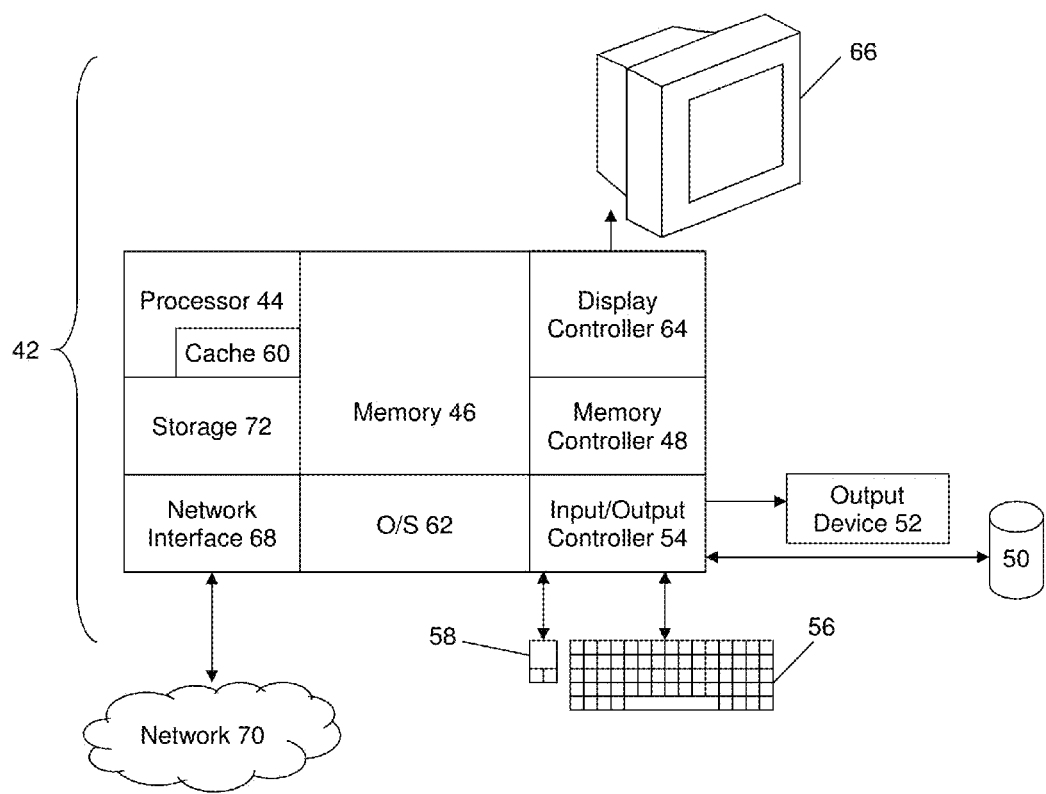
FIG. 2 depicts a block diagram of a computer system for implementing some or all aspects of the system, according to some embodiments of this disclosure.

In one embodiment, the systems 36, 38, 40 are computer systems, such as that illustrated in FIG. 2 for use in implementing a system or method according to some embodiments. The systems and methods described herein may be implemented in hardware, software (e.g., firmware), or a combination thereof. In some embodiments, the methods described may be implemented, at least in part, in hardware and may be part of the microprocessor of a special or general-purpose computer system 42, such as a personal computer, workstation, minicomputer, or mainframe computer.

In some embodiments, as shown in FIG. 2, the computer system 42 includes a processor 44, memory 46 coupled to a memory controller 48, and one or more input devices 50 and/or output devices 52, such as peripherals, that are communicatively coupled via a local I/O controller 54. These devices 50 and 52 may include, for example, a printer, a scanner, a microphone, and the like. Input devices such as a conventional keyboard 56 and mouse 58 may be coupled to the I/O controller 54. The I/O controller 54 may be, for example, one or more buses or other wired or wireless connections, as are known in the art. The I/O controller 54 may have additional elements, which are omitted for simplicity, such as controllers, buffers (caches), drivers, repeaters, and receivers, to enable communications.

The I/O devices 56, 58 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 44 is a hardware device for executing hardware instructions or software, particularly those stored in memory 46. The processor 44 may be a custom made or commercially available processor, a central processing unit (CPU), an auxiliary processor among several processors associated with the computer system 42, a semiconductor based microprocessor (in the form of a microchip or chip set), a macroprocessor, or other device for executing instructions. The processor 44 includes a cache 60, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 60 may be organized as a hierarchy of more cache levels (L1, L2, etc.).

The memory 46 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 46 may incorporate electronic, magnetic, optical, or other types of storage media. Note that the memory 46 may have a distributed architecture, where various components are situated remote from one another but may be accessed by the processor 44.

The instructions in memory 46 may include one or more separate programs, each of which comprises an ordered listing of executable instructions for implementing logical functions. In the example of FIG. 2, the instructions in the memory 46 include a suitable operating system (OS) 62. The operating system 62 essentially may control the execution of other computer programs and provides scheduling, input-output control, file and data management, memory management, and communication control and related services.

Additional data, including, for example, instructions for the processor 44 or other retrievable information, may be stored in storage 72, which may be a storage device such as a hard disk drive or solid state drive. The stored instructions in memory 46 or in storage 72 may include those enabling the processor to execute one or more aspects of the systems and methods of this disclosure.

The computer system 42 may further include a display controller 64 coupled to a display 66. In some embodiments, the computer system 42 may further include a network interface 68 for coupling to a network 70. The network 70 may be an IP-based network for communication between the computer system 42 and an external server, client and the like via a broadband connection. The network 70 transmits and receives data between the computer system 42 and external systems. For example, the network 70 may connect the learning system 40 and predictive analytics system 38 to a remote terminal unit (RTU) that interfaces with the BMS/DCIM network, which may in an embodiment operate on a MODBUS, RS-485, or Bacnet network. In some embodiments, the network 70 may be a managed IP network administered by a service provider. The network 70 may be implemented in a wireless fashion, e.g., using wireless protocols and technologies, such as WiFi, WiMax, etc. The network 70 may also be a packet-switched network such as a local area network, wide area network, metropolitan area network, the Internet, or other similar type of network environment. The network 70 may be a fixed wireless network, a wireless local area network (LAN), a wireless wide area network (WAN) a personal area network (PAN), a virtual private network (VPN), intranet or other suitable network system and may include device for receiving and transmitting signals.

Systems and methods according to this disclosure may be embodied, in whole or in part, in computer program products or in computer systems 42, such as that illustrated in FIG. 2.

Figure 3:
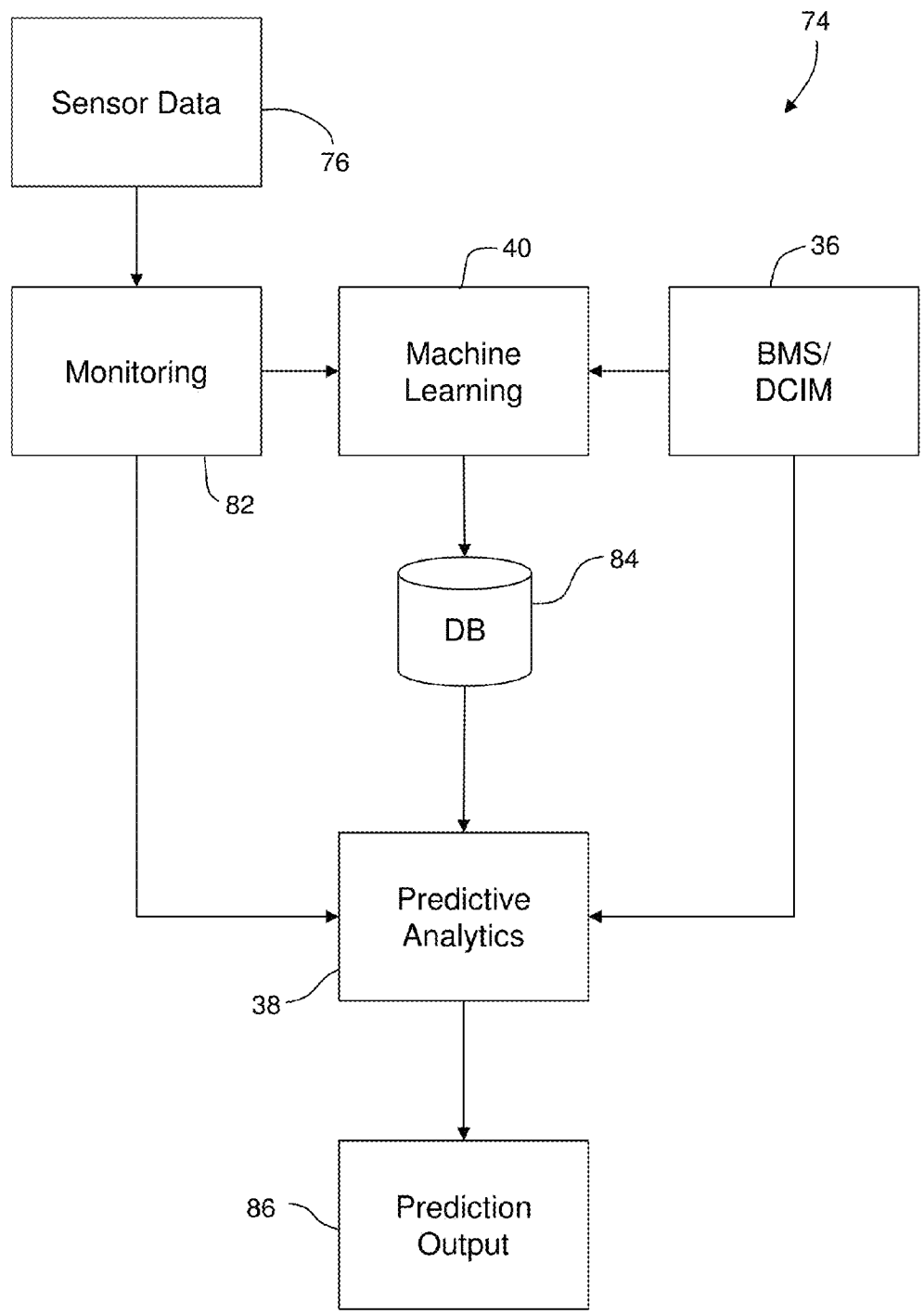
FIG. 3 is a data flow diagram of a system for predicting a time to reach a temperature threshold in accordance with some embodiments of this disclosure.

Referring now to FIG. 3, with continuing reference to FIG. 1, an embodiment of a data flow process 74 for determining a time for an electronic device 22 in data center 20 to reach a maximum operating temperature threshold. The process 74 starts by collecting sensor data in block 76. This sensor data may include, but is not limited to, an air inlet temperature sensor 78, power input sensor 80 (FIG. 1), humidity sensors, pressure sensors, air flow sensors, indoor ambient temperature and outdoor ambient temperatures. The temperature sensors 78 may each be associated with one of the electronic devices 22 or there may be a limited number of temperature sensors 78 per rack 24 that measure the temperature of a particular region (e.g. top portion, middle portion, bottom portion of rack 24). Similarly, the power input sensors 80 may include a single sensor for each electronic device 22, or a single sensor for the entire rack 24. Additionally, sensors 78 and 80 may be sensors that are embedded within electronics device 22 and values communicated to the BMS/DCIM system 36 by one or more communication protocols, such as SNMP or TCP IP for example.

The measurements from the sensors are transmitted to a monitoring system 82 that collects the data and transfers it to a machine learning system 40. The monitoring system 82 further transmits the sensor data in real-time to the predictive analytics system 38. The machine learning system 40 uses machine learning models to learn how the data center 20 operates. The machine learning system 40 receives data from the monitoring system 82 and the BMS/DCIM system 36 and uses machine learning techniques to develop models that may be used to predict behavior of the data center 20 and the individual electronic devices 22 under different conditions. It should be appreciated that any suitable machine learning approach may be used, such as but not limited to, decision tree learning, association rule learning, artificial neural networks, inductive logic programming, clustering and Bayesian networks for example.

As will be discussed in more detail below, these models are stored in a database 84 for use by the analytics system 38. The machine learning models can be formed, trained, and cross-validated on past data. The machine learning models can further be improved on a continuous, periodic or on an aperiodic basis by monitoring the sensors on a continuous (real-time) or during a periodic or aperiodic time periods. In one embodiment the machine learning models determine an expected temperature performance for each electronic device based on a variety of factors, such as the time of day, the day of week, the month of year, the outside environmental temperature, workload levels and the operating state of the cooling system for example.

The process 74 further includes a predictive analytics system 38 that receives signals embodying data from the monitoring system 82, the database 84 and the BMS/DCIM system 36. The predictive analytics system 38 uses the models from database 84 and the real-time acquired data from the monitoring system 82 and the BMS/DCIM system 36 to predict operating parameters for the data center 20 and the electronic devices 22. In one embodiment, the predictive analytics system 38 compares a current operation parameter, such as the current rate of change of temperature of the inlet air temperature to an electronic device with a threshold. When the operating parameter exceeds (or falls below) the threshold, the predictive analytics system 38 determines an expected time period to when a second operating parameter, such as the maximum operating temperature for the electronic device 22 for example, is achieved. The predictive analytics system 38 then provides an output 86. The output 86 may represent a transformation of the prediction data into another form. In an embodiment, the output 86 from the predictive analytics system 38 may be a signal to the operator, a printed report, a change in the operation of the data center 20 (e.g. change the cooling settings/capacity) or the moving of workloads from one electronic device 22 to another.

In an embodiment, the predictive analytics system 38 determines the current operating parameter for each electronic device 22 in the data center 20. In another embodiment, the predictive analytics system 38 determines the current operating parameter for each rack 24. In still another embodiment, the predictive analytics system 38 determines the current operating parameter for each row 26.

It should be appreciated that while embodiments herein describe the monitoring system 82, the machine learning system 40, the BMS/DCIM system 36 and the predictive analytics system 38 as being discrete and separate components, in an embodiment, one or more of these systems may be integrated into separate modules within a single system. In another embodiment, these systems may be executed using a single electronic computing device or computer server.

Figure 4:
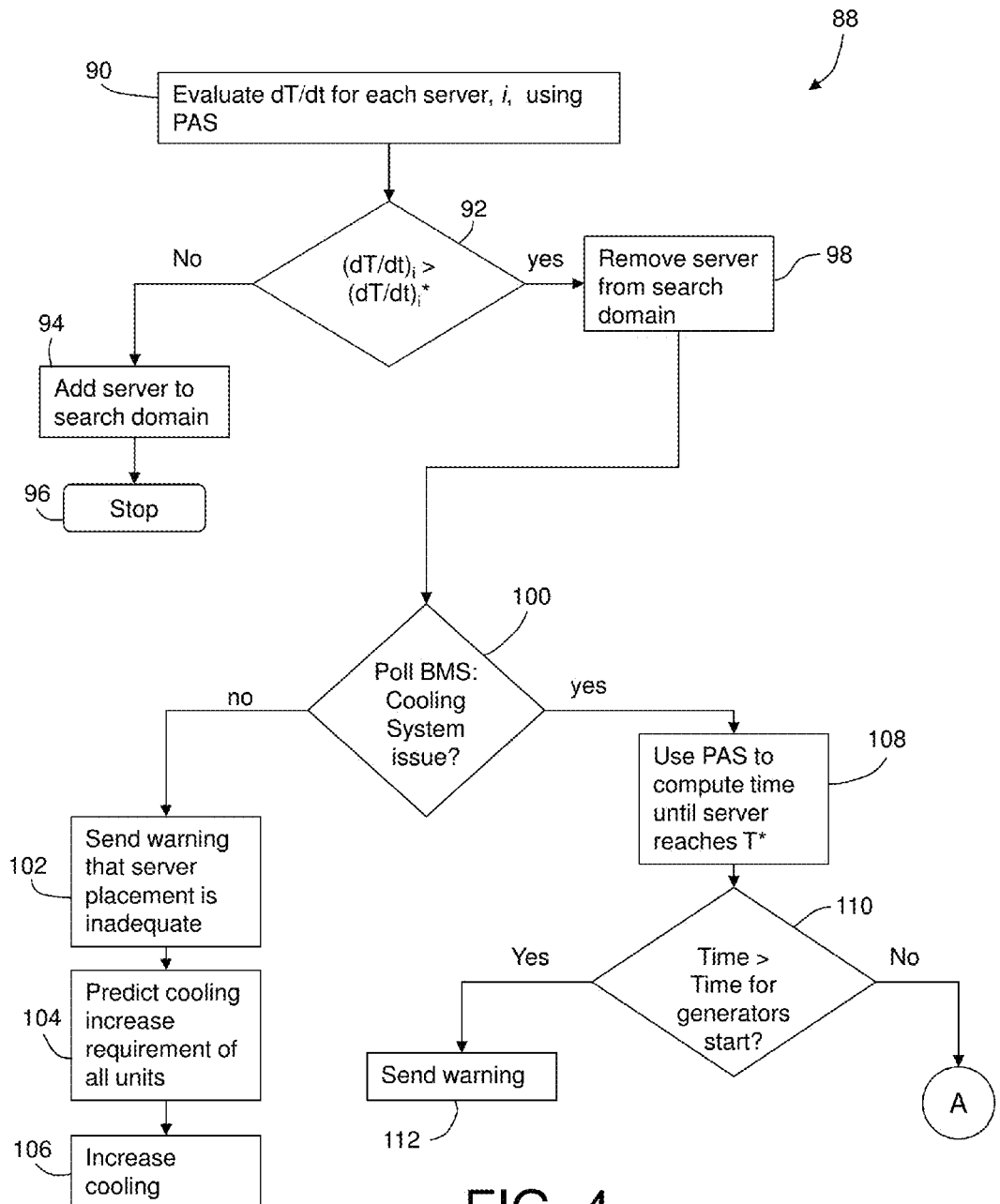
FIG. 4 and FIG. 5 are flow diagrams of a process for predicting a time to reach a temperature threshold and mitigate an undesirable event in accordance with some embodiments of this disclosure.
Figure 5:
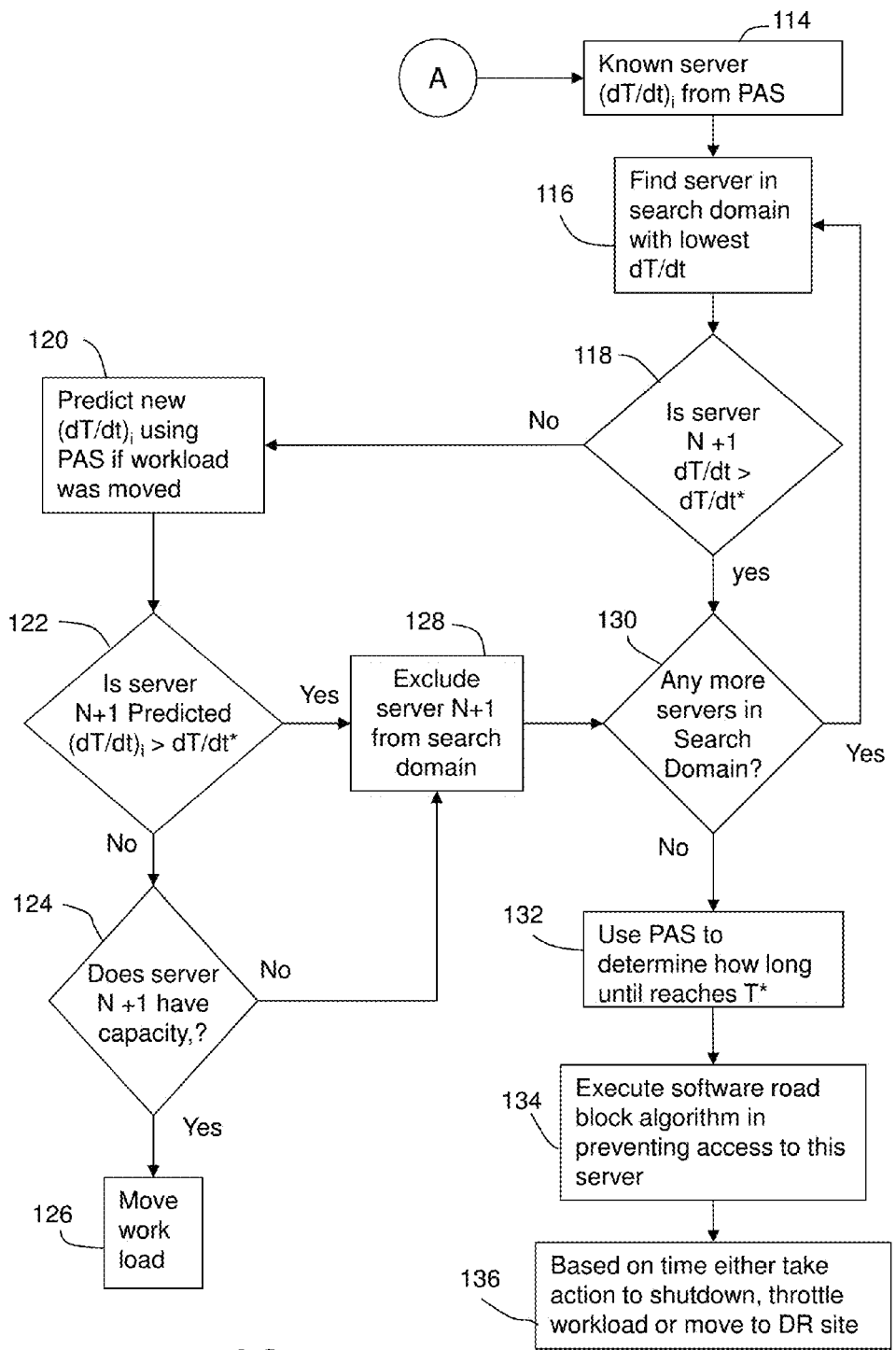

Referring now to FIG. 4 and FIG. 5, an exemplary process 88 is shown for predicting a time period for when a particular electronic device 22 or computer server will reach a maximum operating temperature for that device. It should be appreciated that while the embodiment describes the process with respect to a single computer server 22 within the data center 20, the process is performed for each computer server either sequentially or in parallel. The process 88 starts in block 90 where the predictive analytics system 38 evaluates the current rate of change of temperature (dT/dt) for the computer server 22. The process 88 then proceeds to query block 92 where the current dT/dt is compared with a threshold rate of change of temperature (dT/dt*). The threshold dT/dt* may be defined by the data center operator, or by an industry standard such as the aforementioned ASHRAE TC 9.9 2011 Thermal Guidelines for Data Processing Environments. In one embodiment, the threshold dT/dt* is 20 C/hr. In one embodiment, the threshold dT/dt* is determined using the machine learning system 40.

When the query block 92 returns a negative, the process 88 moves to block 94 where the computer server that was just evaluated is added to a search domain. As used herein, a search domain is a list or database of computer servers 22 that are operating with a current dT/dt that is less than the threshold dT/dt*. As will be discussed in more detail below, the search domain may be used by the process 88 to move workloads from a first computer server 22 to a second computer server 22 to reduce the thermal energy generated by the first computer server 22 and reduce the first computer servers current dT/dt. After adding the evaluated computer server 22 to the search domain, the process 88 stops in block 96.

When the query block 92 returns a positive, meaning that the current dT/dt is greater than or equal to a threshold dT/dt*, the process 88 moves to block 98 where the evaluated computer server 22 is removed from the search domain. It should be appreciated that by removing the evaluated computer server 22 from the search domain, the transfer of additional workloads (and the associated increase in thermal energy generation) is avoided. The process 88 then proceeds to query block 100 where the BMS/DCIM system 36 is queried to determine if there is an issue with the data centers cooling system. There could be a number of issues that impact the cooling capacity of the cooling system, such as but not limited to, a power failure from the utility network and a mechanical failure of one or more components within the cooling system. It should be appreciated that a mechanical failure may not result in the cooling system not operating, but rather may result in a decreased performance of one or more components within the cooling system that degrade the cooling capacity either locally within the data center 20 or for the entire data center 20.

When the query block 100 turns a negative, meaning the data center cooling system is functioning properly, the process 88 moves to block 102 where a signal is transmitted to the data center operator that the cooling system capacity or the placement of the evaluated computer server 22 should be changed. The signal transmitted to the operator may be electronic, such as by an e-mail or a cellular phone SMS text message for example, or a printed report. The process 88 proceeds to block 104 and completes the evaluation of all the computer servers 22 and determines an amount cooling capacity increase that would accommodate the operation of the computer servers at a dT/dt that is below the threshold dT/dt*. In block 106, the process 88 transmits a signal to increase the cooling capacity of the data center 20. The cooling capacity may be increased by transmitting the signal to the BMS/DCIM system 36 to increasing the fan speeds of the cooling units 28 for example.

When the query block 100 returns a positive, meaning that there is an issue in the cooling system that is reducing the cooling capacity to the data center 20, the process 88 proceeds to block 108 where the predictive analytics system 38 determines an expected time period until the evaluated computer server 22 achieves a maximum operating temperature threshold T*. It should be appreciated that the temperature T* may be a threshold defined by the equipment manufacturer for providing the desired performance and functionality and that a particular computer server may operate at temperatures above this temperature but with potential adverse impacts to the reliability and durability of the computer server.

Figure 6:
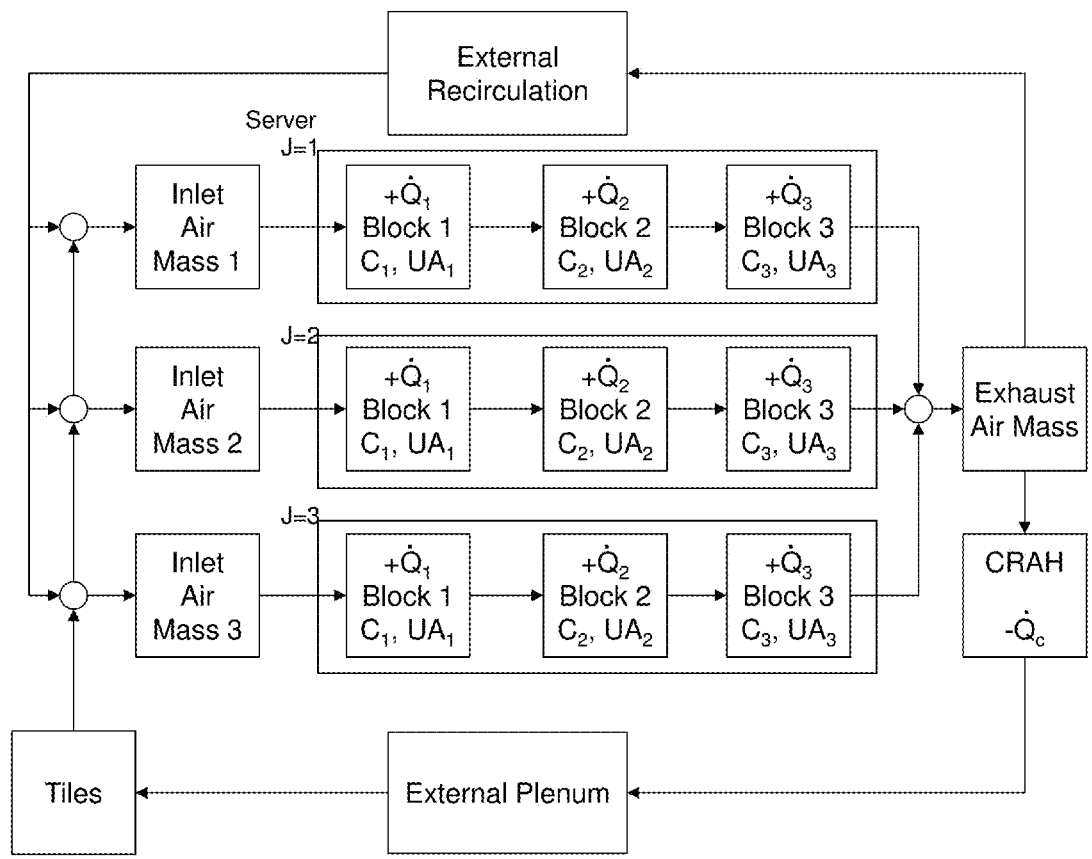
FIG. 6 is a diagram of a lumped capacitance model for determining the time period for an electronic device in the data center of FIG. 1 to reach a threshold temperature.

The predictive analytics system 38 may use any known predictive technique to determine the time prior to reach the temperature T*. In one embodiment, the predictive analytics system 38 may use linear extrapolation for example. In another embodiment, the predictive analytics system 38 uses a lumped capacitance model shown in FIG. 6, such as that described in Hamza Salih Erden, H. Ezzat Khalifa & Roger R. Schmidt (2014) A hybrid lumped capacitance-CFD model for the simulation of data center transients, HVAC&R Research, 20:6, 688-702, DOI: 10.1080/10789669.2014.930280 for example. The capacitance model determines a capture index $\Psi j$ from the sensor data in the machine learning system 40 and a bulk temperature $T^b_{k,j}(t)$ as shown in Equation (1) and Equation (2):

$$\psi_j = 1 - \frac{T_{1,j} - T_t}{T_m - T_t} = 1 - \frac{T_{1,j} - T_t}{\dot{Q}/\dot{C}_c}, \quad \text{Eq. 1}$$

$$T^b_{k,j}(t) = \frac{T^b_{k,j}(t - \delta t)\left[1 - \frac{\delta t}{2\tau_{k,j}}\right] + \left[\frac{\delta t \bar{\dot{Q}}_{k,j}}{C_{k,j}} + \frac{\delta t}{\tau_{k,j}}\bar{T}_{k,j}\right]}{\left[1 + \frac{\delta t}{2\tau_{k,j}}\right]} \quad \text{Eq. 2}$$

Where for Equation 1, T is the measured temperature, $\dot{Q}$ is the measured input power and $\dot{C}_c$ is the cooling air capacitance. For Equation 2, the lumped capacitance temperature at each computer server is determined as a function of time from the measured temperature $T_{k,j}$, the measured input power $\bar{\dot{Q}}_{k,j}$ and two variables $C_{k,j}$ and $\tau_{k,j}$ which are characteristics of IT equipment 22 The variables $C_{k,j}$ and $\tau_{k,j}$ may be inputs from the machine learning system 40 or be a constant for the evaluated computer server. From Equation 1 and Equation 2 an energy balance may be determined for the evaluated computer server 22 as shown in Equation 3.

$$C_{in,j}\frac{dT_{1,j}}{dt} = \dot{C}_{a,j}\psi_j T_t + \dot{C}_{a,j}(1 - \psi_j)T_{r,j} - \dot{C}_{a,j}T_{1,j} \quad \text{Eq. 3}$$

Where $T_t$ is the temperature of the air output by the cooling units 28. Using Equation 3, the predictive analytics system 38 may determine an expected time period for the evaluated computer server 22 to reach the threshold temperature T*.

With the time period determined, the process 88 proceeds to block 110 where it is determined if there is sufficient time to correct the issue with the cooling system before the determined time period expires. For example, if the issue is a power failure from the electrical grid, query block 110 may compare the determined time period with the amount of time for the backup electrical generator 34 to start and the cooling system to resume operation. If the issue is a mechanical issue, query block 110 may compare the determined time period to the expected response time from the HVAC service personnel for example. When the time to correct the issue with the cooling system is less than the determined time period, the query block 110 returns a positive and the process 88 proceeds to block 112 where a warning signal is transmitted to the data center operator. When query block 110 returns a negative, the process 88 proceeds to block 114 of FIG. 5.

In an embodiment, when the query block 110 returns a negative, this means that there may be insufficient time to correct the issue with the cooling system before the evaluated computer server 22 reaches the threshold temperature T*. In this embodiment, the process 88 may take proactive steps to reduce the dT/dt of the evaluated computer server 22 to avoid reaching the threshold temperature T* or increase the time period before the threshold temperature T* is reached. It should be appreciated that these proactive steps may be performed automatically, such as by the predictive analytics system 38 for example, or recommended actions may be transmitted to the data center operator.

In this embodiment, the process 88 compares the computer servers 22 in the search domain to determine the computer server 22 with the lowest rate of change of temperature dT/dt in block 116. The rate of change dT/dt of the identified computer server 22 is then compared in query block 118 to determine if the rate of change dT/dt of the identified computer server 22 is greater than or equal to the threshold dT/dt*. When the query block 118 returns a negative, the process 88 proceeds to block 120 where the predictive analytics system 38 determines a new rate of change $(dT/dt)_i$ for the identified computer server 22 if the workload currently executing on the evaluated computer server 22 is transferred to the identified computer server. It should be appreciated that the transferring of the workload may be the entire workload or a portion of the workload.

The process 88 then proceeds to query block 122 where it is determined if the new rate of change $(dT/dt)_i$ for the identified server is greater than or equal to the threshold dT/dt*. When query block 122 returns a negative, meaning that the new rate of change $(dT/dt)_i$ will allow the identified computer server 22 to operate within desired operating conditions, then the process 88 proceeds to query block 124 where it is determined if the identified computer server 22 has sufficient capacity or bandwidth to accept the additional workload from the evaluated computer server 22. When the query block 124 returns a positive, the workload is transferred from the evaluated computer server 22 to the identified computer server 22 in block 126 and the process stops.

When the query block 122 returns a positive or the query block 124 returns a negative, the process 88 moves to block 128 and the identified computer server 22 is excluded from the search domain. The process 88 then proceeds to block 130 where it is determined if there are any more computer servers 22 in the search domain. When the query block 130 returns a positive, the process 88 loops back to block 116 and repeat the steps with the computer server with the next lowest rate of change dT/dt. When query block 130 returns a negative, meaning there are no computer servers 22 within the search domain, the process 88 proceeds to block 132. In block 132, the predictive analytics system 38 determines again the time period until the threshold temperature T* is reached. The process 88 then proceeds to block access to the computer server in block 134. Depending on the time available, the process 88 may perform a mitigation step in block 136. The mitigation step will be determined based on the amount of time until the threshold temperature T* is reached. The mitigation steps include shutting down the evaluated computer server 22, reducing the performance of the evaluated computer server 22 (e.g. reducing the clock-speed of the processor), or moving the workload to another data center.

Technical effects and benefits of some embodiments include automatically determining when the rate of change of temperature associated with an electronic device in a data center exceeds a threshold and determining the time period available for correcting the issue before the operation, reliability or durability of the computer server are impacted. The time period is determined based on machine learning models developed from historical and real-time date.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method for determining a time to a threshold temperature of an electronic device in a data center, the method comprising:
 measuring with a plurality of sensors a plurality of operating parameters for a first electronic device and the data center;
 determining a first rate of change of temperature for the first electronic device, the first electronic device being operated with a first workload, the first rate of change of temperature based at least in part on the plurality of operating parameters;
 comparing the first rate of change to a rate of change threshold;
 determining that a data center cooling system is operating below a performance threshold in response to the first rate of change being above the performance threshold;
 determining a first time to a first temperature being above a device threshold, the first temperature associated with the first electronic device, the determination of the first time based at least in part on the first rate of change of temperature and a machine learning model;
 comparing the first time to a second time, the second time being a time period for restoring the data center cooling system to above the performance threshold; and transmitting a warning signal to an operator in response to the first time being less than the second time.

2. The method of claim 1 further comprising:
transmitting a cooling system signal to the operator in response to the first rate of change being above the rate of change threshold and the data center cooling system is operating at or above the performance threshold;
determining a cooling capacity level to reduce the first rate of change to below the rate of change threshold; and
changing an operation of the data center cooling system to generate at the cooling capacity level.

3. The method of claim 1 further comprising adding the first electronic device to a search domain in response to the first rate of change being below the rate of change threshold.

4. The method of claim 1 further comprising:
determining a second rate of change of temperature of a second electronic device, the second electronic device having a second workload and an associated capacity for workloads; and
comparing the second rate of change with the rate of change threshold.

5. The method of claim 4 further comprising:
determining a proposed rate of change of temperature for the second electronic device in response to the second rate of change being less than or equal to the rate of change threshold, the proposed rate of change of temperature being based on a transferring of a portion of the first workload from the first electronic device and added to the second workload;
comparing the proposed rate of change to the rate of change threshold;
comparing a sum of the portion of the first workload and the second workload to a capacity for workloads in response to the proposed rate of change being less than the rate of change threshold; and
moving the portion of the first workload to the second electronic device in response to the sum of the portion of the first workload and the second workload being less than or equal to the capacity for workloads.

6. The method of claim 5 further comprising:
removing the first electronic device from a search domain; and
removing the second electronic device from the search domain in response to the portion of the first workload and the second workload being greater than the capacity for workloads.

7. The method of claim 6 further comprising:
determining that the search domain includes additional electronic device; and
determining which of the additional electronic device has a lowest rate of change of temperature.

8. The method of claim 4 further comprising:
determining a third time to the first temperature being above the device threshold, the determination of the third time based at least in part on the first rate of change of temperature and the machine learning model; and
perform a mitigating step in response to determining the third time, the mitigating step selected from a group consisting of shutting down the electronic device, reducing a performance level of the electronic device and moving the first workload to a second data center.

9. A system for determining a time to a threshold temperature of an electronic device in a data center, the system comprising:
a memory having computer readable instructions; and
one or more processors for executing the computer readable instructions, the one or more processors being coupled to communicate with the plurality of sensors, the computer readable instructions comprising:
measuring with a plurality of sensors a plurality of operating parameters for a first electronic device and the data center;
determining a first rate of change of temperature for the first electronic device, the first electronic device being operated with a first workload;
comparing the first rate of change to a rate of change threshold, the first rate of change of temperature being based at least in part on the plurality of operating parameters;
determining that a data center cooling system is operating below a performance threshold in response to the first rate of change being above the rate of change threshold;
determining a first time to a first temperature being above a device threshold, the first temperature being associated with the first electronic device, the determination of the first time based at least in part on the first rate of change of temperature and a machine learning model;
comparing the first time to a second time, the second time being a time period for restoring the data center cooling system to above the performance threshold; and
transmitting a warning signal to an operator in response to the first time being less than the second time.

10. The system of claim 9 wherein the computer readable instructions further comprise:
transmitting a cooling system signal to the operator in response to the first rate of change is above the rate of change threshold and the data center cooling system is operating at or above the performance threshold;
determining a cooling capacity level to reduce the first rate of change to below the rate of change threshold; and
changing an operation of the data center cooling system to generate at the cooling capacity level.

11. The system of claim 9 wherein the computer readable instructions further comprise adding the first electronic device to a search domain the first rate of change is below the rate of change threshold.

12. The system of claim 9 wherein the computer readable instructions further comprise:
determining a second rate of change of temperature of a second electronic device, the second electronic device having a second workload and an associated capacity for workloads; and
comparing the second rate of change to the rate of change threshold.

13. The system of claim 12 wherein the computer readable instructions further comprise:
determining a proposed rate of change of temperature for the second electronic device in response to the second rate of change being less than or equal to the rate of change threshold, the proposed rate of change of temperature being based on a transferring of a portion of the first workload from the first electronic device and added to the second workload;
comparing the proposed rate of change to the rate of change threshold;
comparing a sum of the portion of the first workload and the second workload to a capacity for workloads in response to the proposed rate of change being less than the rate of change threshold; and
moving the portion of the first workload to the second electronic device in response to the sum of the portion of the first workload and the second workload being less than or equal to the capacity for workloads.

14. The system of claim 13 wherein the computer readable instructions further comprise removing the second electronic device from a search domain in response to the portion of the first workload and the second workload being greater than the capacity for workloads.

15. The system of claim 14 wherein the computer readable instructions further comprise:
   determining that the search domain includes additional electronic device; and
   determining which of the additional electronic device has a lowest rate of change of temperature.

16. The system of claim 12 wherein the computer readable instructions further comprise:
   determining a third time to until the first temperature is above the device threshold, the determination of the third time based at least in part on the first rate of change of temperature and the machine learning model; and
   perform a mitigating step in response to determining the third time, the mitigating step selected from a group consisting of shutting down the electronic device, reducing a performance level of the electronic device and moving the first workload to a second data center.

17. A computer program product for determining a time to a threshold temperature of an electronic device in a data center, the computer program product comprising a computer readable storage medium having program instructions embodied therewith, the program instructions executable by a processor to cause the processor to perform:
   a memory having computer readable instructions; and
   one or more processors for executing the computer readable instructions, the computer readable instructions comprising:
   measuring with a plurality of sensors a plurality of operating parameters for a first electronic device and the data center;
   determining a first rate of change of temperature for the first electronic device, the first electronic device being operated with a first workload;
   comparing the first rate of change to a rate of change threshold, the first rate of change of temperature being based at least in part on the plurality of operating parameters;
   determining that a data center cooling system is operating below a performance threshold in response to the first rate of change is above the performance threshold;
   determining a first time to a first temperature being above a device threshold, the first temperature being associated with the first electronic device, the determination of the first time based at least in part on the first rate of change of temperature and a machine learning model;
   comparing the first time to a second time, the second time being a time period for restoring the data center cooling system to above the performance threshold; and
   transmitting a warning signal to an operator in response to the first time being less than the second time.

18. The computer program product of claim 17 wherein the program instructions executable by the processor to cause the processor to perform:
   transmitting a cooling system signal to the operator in response to the first rate of change being above the rate of change threshold and the data center cooling system is operating at or above the performance threshold;
   determining a cooling capacity level to reduce the first rate of change to below the rate of change threshold;
   changing an operation of the data center cooling system to generate at the cooling capacity level; and
   adding the first electronic device to a search domain in response to the first rate of change is below the rate of change threshold.

19. The computer program product of claim 17 wherein the program instructions executable by the processor to cause the processor to perform:
   determining a second rate of change of temperature of a second electronic device, the second electronic device having a second workload and an associated capacity for workloads; determining a proposed rate of change of temperature for the second electronic device in response to the second rate of change being less than or equal to the rate of change threshold, the proposed rate of change of temperature being based on a transferring of a portion of the first workload from the first electronic device and added to the second workload;
   comparing the proposed rate of change to the rate of change threshold;
   comparing a sum of the portion of the first workload and the second workload to a capacity for workloads in response to the proposed rate of change being less than the rate of change threshold; and
   moving the portion of the first workload to the second electronic device in response to the sum of the portion of the first workload and the second workload being less than or equal to the capacity for workloads; and
   comparing the second rate of change the rate of change threshold.

20. The computer program product of claim 17 wherein the program instructions executable by the processor to cause the processor to perform:
   determining a third time to until the first temperature is above the device threshold, the determination of the third time based at least in part on the first rate of change of temperature and the machine learning model; and
   perform a mitigating step in response to determining the third time, the mitigating step selected from a group consisting of shutting down the electronic device, reducing a performance level of the electronic device and moving the first workload to a second data center.

* * * * *